(12) United States Patent
Shiozaki

(10) Patent No.: US 6,506,622 B1
(45) Date of Patent: Jan. 14, 2003

(54) METHOD OF MANUFACTURING A PHOTOVOLTAIC DEVICE

(75) Inventor: Atsushi Shiozaki, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 223 days.

(21) Appl. No.: 09/704,805

(22) Filed: Nov. 3, 2000

Related U.S. Application Data

(62) Division of application No. 09/221,870, filed on Dec. 29, 1998, now Pat. No. 6,222,117.

(30) Foreign Application Priority Data

Jan. 5, 1998 (JP) ............................................. 10-000056

(51) Int. Cl.⁷ .................... H01L 21/00; H01L 31/0236; H01L 31/0232; H01L 31/06
(52) U.S. Cl. ...................... 438/73; 136/255; 136/256; 257/436; 257/465; 257/622; 257/653
(58) Field of Search ........................ 438/73, 665, 964, 438/66; 136/256, 255; 257/436, 465, 622, 653

(56) References Cited

U.S. PATENT DOCUMENTS

| | | | |
|---|---|---|---|
| 4,419,533 A | 12/1983 | Czubatyj et al. | 136/259 |
| 4,703,337 A | 10/1987 | Yamazaki | 357/30 |
| 4,728,370 A | 3/1988 | Ishii et al. | 136/258 |
| 4,829,013 A | 5/1989 | Yamazaki | 432/2 |
| 5,230,746 A | 7/1993 | Wiedeman et al. | 136/249 |
| 5,370,747 A | 12/1994 | Noguchi et al. | 136/259 |
| 5,486,238 A | 1/1996 | Nakagawa et al. | 136/259 |
| 5,500,055 A | 3/1996 | Toyama et al. | 136/259 |
| 5,654,883 A | 8/1997 | Takehara et al. | 363/79 |
| 5,682,308 A | 10/1997 | Kurokami et al. | 363/79 |
| 5,711,824 A | 1/1998 | Shinohara et al. | 136/259 |
| 5,885,725 A | 3/1999 | Toyama et al. | 429/9 |
| 6,222,117 B1 * | 4/2001 | Shiozaki | 136/256 |

FOREIGN PATENT DOCUMENTS

JP      5-218469      8/1993

OTHER PUBLICATIONS

J. Meier et al., "On the Way Towards High Efficiency Thin Film Silicon Solar Cells by the Micromorph Concept," *Mat. Res. Soc. Symp. Proc.*, vol. 420, pp. 3–14 (1996). No month.

* cited by examiner

Primary Examiner—Harold Pyon
Assistant Examiner—Michael C Miggins
(74) Attorney, Agent, or Firm—Fitzpatrick, Cella, Harper & Scinto

(57) ABSTRACT

The present invention provides a photovoltaic device being capable of generating a large amount of current even with thin joined semiconductor layers, has a high photoelectric conversion efficiency and can be manufactured inexpensively at a low temperature together with a manufacturing method of the same, a photovoltaic device integrated with a building material and a power-generating apparatus. The photovoltaic device is formed by depositing joined semiconductor layers on a substrate, wherein a ratio of projected areas of regions on a surface of the joined semiconductor layers that have heights not smaller than a center value of concavities and convexities to a projected area of the entire surface of the joined semiconductor layers is higher than a ratio of projected areas of regions on the surface of the substrate that have heights not smaller than a center value of concavities and convexities on a surface of the substrate to a projected area of the entire surface of the substrate.

17 Claims, 2 Drawing Sheets

METHOD OF MANUFACTURING A PHOTOVOLTAIC DEVICE

This application is a division of application Ser. No. 09/221,870, filed Dec. 29, 1998, now U.S. Pat. No. 6,222,117 B1.

BACKGROUND OF THE INVENTION

1. Field of the Invention

The present invention relates to a photovoltaic device such as a solar cell and a sensor which has a high conversion efficiency from light to electricity and allows little deterioration of the conversion efficiency with time even after long outdoor use, a manufacturing method of the same, a photovoltaic device integrated with a building material and a power-generating apparatus.

2. Related Background Art

Various photovoltaic devices have already been used as independent power sources for electric appliances and energy sources substituting for systematic electric power sources. Considering the cost required for generating unit electric power, however, the photovoltaic devices are still too expensive for use as substitute energy sources for the systematic electric power sources. Research is therefore actively being made to develop new photovoltaic devices.

As for technologies related to materials for photovoltaic devices, for example, research is made for crystalline materials that consist of single crystal or polycrystal silicon, amorphous silicon (a-Si), microcrystalline silicon ($\mu$c-Si) and the so-called thin film materials that use compound semiconductors and on.

Speaking of solar cells that use microcrystalline silicon, Mat. Res. Soc. Symp. Proc. Vol. 420, p.3, 1996, J. Meier, H. Keppner, A. Shah, et al. reported that a solar cell obtained by the plasma CVD method using VHF (70 MHz) exhibited a photoelectric conversion efficiency of 7.7% with no deterioration by light. Furthermore, this literature reported that an initial photoelectric conversion efficiency of 13.1% was obtained with a solar cell which was manufactured by laminating amorphous silicon and microcrystalline silicon.

Furthermore, Drafts for the Spring Meeting of the Japan Society of Applied Physics Vol. 2, p.764, Article 30 p-B-4, reported a technology to form concavities and convexities on a surface of polycrystalline silicon.

Moreover, U.S. Pat. No. 4,419,533 discloses a technology to prepare a metallic reflecting layer so as to have concavities and convexities on a back surface of joined semiconductor layers, and dispose a barrier layer of zinc oxide on the joined semiconductor layers to prevent elements of the reflecting layer from being dispersed into the superposed semiconductor layers.

Japanese Patent Application Laid-Open No. 5-218469 discloses a technology to prepare a metallic reflecting layer so as to be flat, and form concavities and convexities by etching a surface of a barrier layer with an aqueous solution, thereby enclosing light.

While research is made to develop technologies to enhance conversion efficiencies, there has been reported, as a technology to form joined layers of thin film semiconductors at a low cost, a manufacturing technology that successively prepares laminated semiconductor layers on substrates of rolled stainless steel (Roll-to-Roll method) using a microwave for accelerating a deposition rate.

A most important key to decide whether or not photovoltaic devices are to be adopted is whether or not an amount of electricity to be obtained counterbalances amounts of materials used, a cost required for manufacturing, an area for installation, an appearance, etc. The conversion efficiency from light to electricity is not always the most important key to decide whether or not photovoltaic devices are to be used. For this reason, attention is paid to thin film photovoltaic devices that are rather low in conversion efficiencies thereof but can be manufactured at costs overwhelmingly lower than those of crystal type photovoltaic devices that have higher conversion efficiencies.

Accordingly, a problem imposed on photovoltaic devices is how to reduce a total power cost (cost/W). From this viewpoint, thin film type photovoltaic devices of amorphous silicon can be manufactured at a cost lower than that of any other type of photovoltaic devices. Furthermore, the Roll-to-Roll method permits lowering the manufacturing cost.

However, amorphous silicon type semiconductor materials that are typically represented by a-Si and a-SiGe are problematic since they exhibit a phenomenon which allows photoelectric conversion efficiencies thereof to be degraded when irradiated for long term with light corresponding to sunlight (deterioration by light). Though photovoltaic devices that have laminated structures of a-Si/a-SiGe/a-SiGe, a-Si/a-Si/a-SiGe, aSiC/a-SiGe/a-SiGe and so on have been proposed as attempts to suppress the phenomenon of deterioration by light, these attempts are still insufficient as compared with crystalline silicon type photovoltaic devices. In addition, it is not easy to lower manufacturing costs of the photovoltaic devices having the laminated structures since expensive germane ($GeH_4$) gas is used for forming a layer of a-SiGe.

As an attempt to suppress the phenomenon of deterioration by light, examinations are made on a photovoltaic device that uses microcrystalline silicon type materials. Though this photovoltaic device is quite free from the deterioration by light, it has a film thickness of 3.6 $\mu$m, a short-circuit current of 25. 4 $mA/cm^2$ and a photoelectric conversion efficiency that is still as low as 7.7%. Though a-Si/$\mu$c-Si type laminated solar cell exhibits an initial photoelectric conversion efficiency of 13.1%, it is problematic in that an a-Si layer disposed on a side of incidence is remarkably deteriorated by light. Furthermore, it is problematic in that it uses a $\mu$c-Si layer which is as thick as 3.6 $\mu$m and allows deposition at a rate as low as 1.2 Å/sec, thereby requiring a layer formation time on the order of 8 hours and not being industrially practical.

Moreover, a technology reported by Drafts for the Spring Meeting of the Japan Society of Applied Physics Vol. 2, p. 764, Article 30 p-B-4, and the similar technologies that form concavities and convexities on surfaces of polycrystalline silicon, pose a problem that only limited kinds of materials are usable since these technologies require films as thick as 5 $\mu$m and high manufacturing temperatures.

SUMMARY OF THE INVENTION

In view of the circumstances described above, an object of the present invention is to provide a photovoltaic device having excellent collective performance, that is, a photovoltaic device which is capable of generating a large amount of current with thin joined semiconductor layers, has a high photoelectric conversion efficiency, can be inexpensively manufactured at a low temperature and is capable of maintaining the conversion efficiency even after long-term use as well as a manufacturing method of the same, a photovoltaic device integrated with a building material and a power-generating apparatus.

The present invention provides a photovoltaic device comprising joined semiconductor layers on a substrate, wherein the substrate and the joined semiconductor layers have concavities and convexities on surfaces thereof and, when a mean value between a highest point and a lowest point on each of the surfaces is taken as an each center value and each surface is projected in a direction perpendicular to the substrate, a ratio of projected areas of regions on the surface of the joined semiconductor layers that have heights not smaller than the center value to a projected area of the entire surface of the joined semiconductor layers is higher than a ratio of projected areas of regions on the surface of the substrate that have heights not smaller than the center value to a projected area of the entire surface of the substrate.

Furthermore, the present invention provides a manufacturing method of a photovoltaic element comprising depositing joined semiconductor layers on a substrate, wherein concavities and convexities are formed on surfaces of the substrate and the joined semiconductor layers, and when a mean value between a highest point and a lowest point on each of the surfaces is taken as an each center value and each surface is projected in a direction perpendicular to the substrate, a ratio of projected areas of regions on the surface of the joined semiconductor layers that have heights not smaller than the center value to a projected area of the entire surface of the joined semiconductor layers is made higher than a ratio of projected areas of regions on the surface of the substrate that have heights not smaller than the center value of the substrate to a projected area of the entire surface of the substrate.

Furthermore, the present invention provides a photovoltaic device integrated with a building material comprising a photovoltaic device having joined semiconductor layers on a substrate, a back surface reinforcing member and a sealing member which integrally seals the photovoltaic device and the back surface reinforcing member, wherein the substrate and the joined semiconductor layers have concavities and convexities formed on surfaces thereof and, when a mean value between a highest point and a lowest point on each of the surfaces is taken as an each center value and each surface is projected in a direction perpendicular to the substrate, a ratio of projected areas of regions on the surface of the joined semiconductor layers that have heights not smaller than the center value to a projected area of the entire surface of the joined semiconductor layers is higher than a ratio of projected areas of regions of the substrate that have heights not smaller than the center value to a projected area of the entire surface of the substrate.

In addition, the present invention provides a power-generating apparatus comprising a photovoltaic device having joined semiconductor layers on a substrate and means for converting electric power generated by the photovoltaic device into a predetermined power, the power-generating apparatus comprising:

a photovoltaic device in which the substrate and the joined semiconductor layers have concavities and convexities on surfaces thereof, and when a mean value between a highest point and a lowest point on each of the surfaces as an each center value and each surface is projected in a direction perpendicular to the substrate, a ratio of projected areas of regions on the surface of the joined semiconductor layers that have heights not smaller than the center value to a projected area of the entire surface of the joined semiconductor layers is higher than a ratio of projected areas of regions on the surface of the substrate that have heights not smaller than the center value to a projected area of the entire surface of the substrate;

a power converter into which power from the photovoltaic device is input;

detecting means which detects an output voltage and output current from the photovoltaice device;

output setting means into which signals from the detecting means are input; and a control circuit which controls the power converter on the basis of the signals input into the output setting means.

DESCRIPTION OF THE PREFERRED EMBODIMENTS

Figure 1:
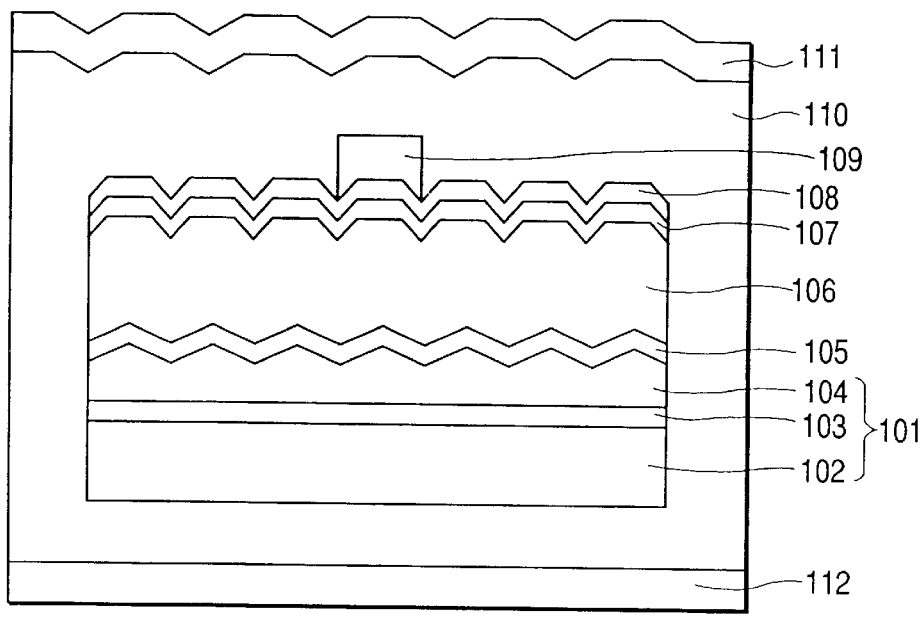
FIG. 1 is a schematic sectional view showing a sectional configuration of an example of the photovoltaic device according to the present invention.

To measure heights of substrates, joined semiconductor layers, maximum points and minimum points, the present invention uses a method that is described below:

300×300 points are measured within a region of 5 $\mu$m×5 $\mu$m with an atomic force microscope. Specifically, the heights mentioned above are calculated as those from a specimen stage of the atomic force microscope. A highest point and a lowest point are determined from these heights, and a center value is determined accordingly (as a mean value between the highest point and the lowest point).

A quotient of a number of measuring points that have heights not smaller than the center value thus determined divided by a total number of the measuring points (300×300) is the ratio of the projected areas of the regions that have heights not smaller than the center value to the projected area of the surface of the substrate (or the entire surface of the joined semiconductor layers) which is referred to in the present invention.

In this specification, an expression "a ratio of projected areas of regions of the joined semiconductor layers that have heights not smaller than the center value of concavities and convexities on the surface thereof to a projected area of the entire surface is higher than a ratio of projected areas of regions of the substrate that have heights not smaller than the center value of concavities and convexities on the surface of the substrate to a projected area of the entire surface of the substrate" may be used for convenience as synonymous with the expression "the substrate and the joined semiconductor layers have concavities and convexities on surfaces thereof and, when a mean value between a highest point and a lowest point on each surface is taken as an each center value and each surface is projected in a direction perpendicular to the substrate, a ratio of projected areas of regions on the surface of the joined semiconductor layers that have heights not smaller than the center value to a projected area of the entire surface of the joined semiconductor layers is higher than a ratio of projected areas of regions on the surface of the substrate that have heights not smaller than the center value to a projected area of the entire surface of the substrate".

In the present invention, it is preferable that the ratio of the projected areas of the regions on the surface of the joined semiconductor layers that have heights not smaller than the center value to the projected area of the entire surface of the joined semiconductor layers is 10% or more higher than the ratio of the projected areas of the regions on the surface of the substrate that have the heights not smaller than the center value to the projected area of the entire surface of the substrate.

Furthermore, it is preferable that the joined semiconductor layers comprises an n-type or p-type first semiconductor layer, a weak n-type, weak p-type or i-type second semiconductor layer and a conductive p-type or n-type third semiconductor layer which is different from the first semiconductor layer. In this case, it is preferable that the i-type semiconductor layer comprises a microcrystalline semiconductor.

Furthermore, it is preferable that the substrate comprises a first electrode layer and a second electrode layer is formed on the joined semiconductor layers.

Moreover, it is preferable that the surface of the substrate has a mean height of 100 to 150 nm, a mean centerline roughness Ra of 100 to 200 nm and the ratio of the projected areas of the regions that have heights not smaller than the center value to the projected area of the entire surface of the substrate is 40 to 80%.

Moreover, it is preferable that the surface of the substrate contains at least one selected from among stainless steel, silver, iron, nickel and aluminium.

Moreover, it is preferable that a transparent conductive layer which is made of at least one selected from among zinc oxide, tin oxide, indium oxide and titanium oxide is disposed on the surface of the substrate.

Moreover, it is preferable that the transparent conductive layer is formed by the sputtering method or electric deposition from an electrolyte.

Moreover, it is preferable that concavities and convexities are formed on the surface of the substrate by dry etching or wet etching.

Moreover, it is preferable that at least a part of the joined semiconductor layers is formed by a plasma CVD method in which $SiH_4$ diluted to 5% or lower with $H_2$ as a raw material gas and a high-frequency power having a frequency of 50 to 550 MHz at a power density of 0.05 to 1.0 $W/cm^3$ are supplied under conditions of a substrate temperature of 150 to 300° C. and a pressure of 0.02 to 0.5 Torr.

Moreover, it is preferable that at least a part of the joined semiconductor layers contains silicon as a principal component, hydrogen atoms and a crystalline phase which exhibits a peak of the (220) surface when analyzed by X-ray diffraction.

Moreover, it is preferable that at least a part of the joined semiconductor layers contains silicon as a principal component, hydrogen and a crystalline phase which exhibits a peak at 510 to 530 $cm^{-1}$ when analyzed by Raman spectrometry using a laser beam of 514.5 nm.

Moreover, it is preferable that there are provided two or more sets of the joined semiconductor layers each of which comprises an n-type or p-type first semiconductor layer, a weak n-type, weak p-type or i-type second semiconductor layer and a conductive p-type or n-type third semiconductor layer which is different from the first semiconductor layer. In this case, it is preferable that at least one layer of the i-type semiconductor layers comprises a microcrystalline semiconductor. In the case of two or more sets of the joined semiconductor layers, it is sufficient that the configurational requirement for the present invention is satisfied by a surface of any one set of the joined semiconductor layers.

Moreover, it is preferable that a quotient of a short-circuit current under sunlight of A.M. 1.5 (100 $mW/cm^2$) divided by a thickness of the second semiconductor layer is not lower than 20 $mA/cm^2/\mu m$.

Moreover, it is preferable for the manufacturing method according to the present invention to supply the high-frequency power mentioned above from electrodes which are disposed at a spacing not exceeding 50 mm and opposed to the substrate.

Moreover, it is preferable to arrange the photovoltaic device in a plurality in series or parallel in the power-generating apparatus according to the present invention.

Moreover, it is preferable that the power converter mentioned above comprises a DC/DC converter using a self arc-suppression type switching element or a self-excitation type DC/AC inverter.

Moreover, it is preferable that the output setting means mentioned above determines an output voltage setting value by performing calculations on the basis of the detection signals from the detecting means mentioned above so that the output voltage from the photovoltaic device is set at the setting value.

In addition, it is preferable that the control circuit mentioned above is a gate driving circuit which generates gate pulses by instantaneous current comparison or sinusoidal wave/triangular wave comparison.

The present invention relates to a new photovoltaic device, a manufacturing method thereof, a photovoltaic device integrated with a building material and a power-generating apparatus as described above. A configuration and functions of the photoeletromotive element will further be described below:

The inventor has achieved the present invention as a result of earnest research made on how to develop a photovoltaic device that is high in a photoelectric conversion efficiency thereof, deteriorated little by light, highly reliable and easy to manufacture.

First, a substrate which has concavities and convexities on a surface thereof is used for manufacturing the photovoltaic device. This substrate may be of a type that serves as electrodes by itself or electrode layers may be formed on the substrate. Furthermore, a reflecting layer may be disposed to reflect light that is not absorbed by a semiconductor layer and a transparent conductive layer may be disposed. The photovoltaic device may be configured to irradiate it with light from a side of the substrate.

Then, an n-type or p-type first semiconductor layer is formed at a thickness of approximately 20 nm on the substrate by the plasma CVD method using a raw material gas of $SiH_4$ to which $PH_3$ and $BF_3$ are added as doping gases. The first semiconductor layer is amorphous in certain manufacturing conditions but may be microcrystallized in manufacturing conditions similar to those for a second semiconductor layer.

While maintaining the substrate at a temperature within a range from 150 to 300° C. and a pressure within a range from 0.02 to 0.5 Torr, a weak n-type, weak p-type or i-type second microcrystallized semiconductor layer is formed at a thickness of 500 to 3000 nm on the first semiconductor layer by the plasma CVD method by feeding $SiH_4/(H_2+SiH_4)$ as a raw material gas at a ratio not exceeding 5% and supplying a high-frequency power having a frequency of 50 to 550 MHz at a power density of 0.05 to 1.0 $W/cm^2$ in a condition where a spacing not exceeding 50 mm is reserved between electrodes. At this step, a doping gas may be added slightly for delicate control of valence electrons.

A p-type or n-type third semiconductor layer which is different from the first semiconductor layer is formed at a thickness of approximately 10 nm on the second semiconductor layer by the plasma CVD method using a raw material gas of $SiH_4$ to which $BF_3$ and $PH_3$ are added as doping gases. Manufacturing conditions for the third semiconductor layer may be selected to make it amorphous or microcrystalline.

The inventor has found that, when a photovoltaic device was manufactured as described above, a ratio of projected areas of regions of the joined semiconductor layers that had heights not smaller than the center value of the concavities and convexities on the surface thereof to a projected area of the entire surface was higher than a ratio of projected areas of regions of the substrate that had heights not smaller than the center value of the concavities and convexities on the surface of the substrate to a projected area of the entire surface of the substrate under an influence due to growth of crystals in the second semiconductor layer, thereby providing a favorable conversion efficiency.

X-ray diffraction analysis of the joined semiconductor layers recognized a peak of the (220) surface and a crystalline phase, but calculations of crystal particle sizes indicated that larger crystal particle sizes did not always provide higher photoelectric conversion efficiencies. Furthermore, Raman spectrometry using a laser beam of 514.5 nm also provided results which permitted recognition of a peak around 520 $cm^{-1}$ and a crystalline phase, indicating that crystals exhibiting higher peaks or having high volumetric ratios did not always provide higher conversion efficiencies.

Within a range examined by the inventor, ratios of projected areas of regions that had heights not smaller than center values of concavities and convexities on surfaces were not enhanced in joined semiconductor layers formed on substrates having flat surfaces or manufactured in conditions different from those mentioned above though some of these joined semiconductor layers contained crystalline phases. In these cases, favorable conversion efficiencies were not obtained with no exception. Surface shapes of the joined semiconductor layers were governed by the surface shapes and the natures of substrates as well as the natures of the first and second semiconductor layers. Third semiconductor layers which were thin produced little influences on the surface shapes.

Now, preferable embodiments of the present invention will be described below, but the present invention should not be limited thereto so far as differences are within the gist of the present invention.

FIG. 1 is a sectional view schematically exemplifying a sectional configuration of the photovoltaic device according to the present invention. In this example, a substrate 101 consists of a reflecting layer 103 of aluminium which is disposed on a support base member 102 made of stainless steel and a transparent conductive layer 104 of zinc oxide which is deposited on the reflecting layer 103 by sputtering or electric deposition from an electrolyte as shown in FIG. 1. Concavities and convexities having sizes of 100 nm to 500 nm are formed on a surface of the transparent conductive layer 104 so as to scatter light, thereby enhancing a photoelectric conversion efficiency. The concavities and convexities may be formed by controlling manufacturing conditions for the transparent conductive layer 104 or large concavities and convexities may be formed by wet etching of a flat surface.

Figure 2:
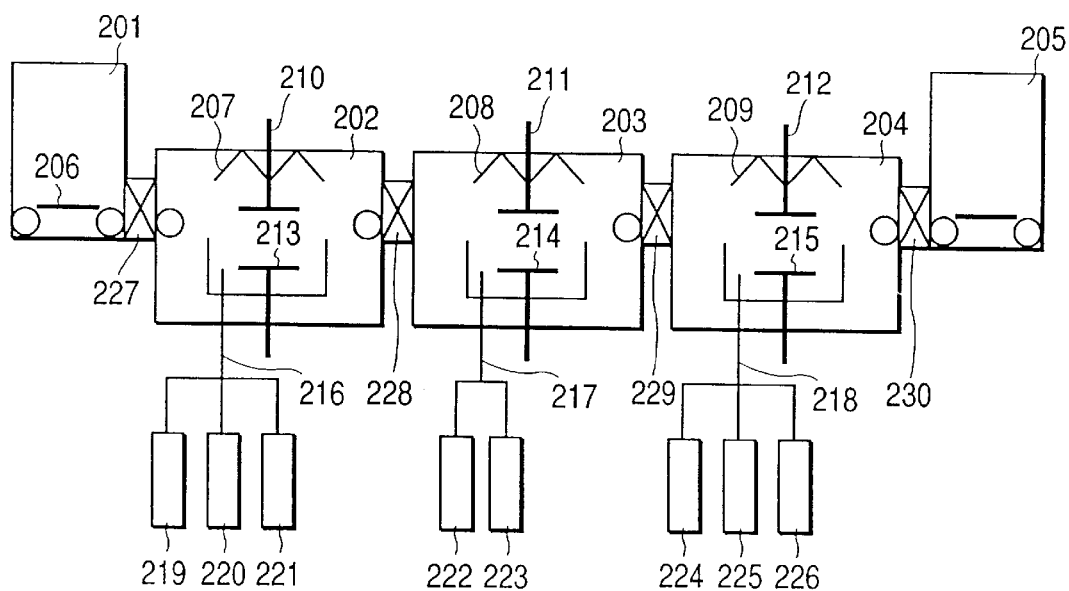
FIG. 2 is a schematic sectional view showing a system preferable for forming joined semiconductor layers according to the present invention.

FIG. 2 is a schematic sectional view showing a system preferable for manufacturing joined semiconductor layers for the photovoltaic device according to the present invention. An example preferable to form joined semiconductor layers for the photovoltaic device according to the present invention will be described below with reference to FIGS. 1 and 2. A substrate 206 is disposed in a vacuum system (specifically in a feeding chamber 201) that consists of a feeding chamber 201, film forming chambers 202, 203, 204 and a recovery chamber 205. In a condition where the feeding chamber 201, the film forming chambers 202, 203, 204 and the recovery chamber 205 are partitioned with gate valves 227 through 230, the manufacturing system is evacuated to a predetermined pressure with a vacuum pump.

Successively, the gate valve 227 is opened between the feeding chamber 201 and the film forming chamber 202 for a first semiconductor layer, the substrate 206 is carried under a substrate holder and electrode 210, and the substrate holder and electrode 210 is lowered until it comes into contact with the substrate 206 and holds the substrate 206. The substrate 206 is heated by a heater 207 and maintained at a predetermined temperature.

Then, the gate valve 227 is closed between the feeding chamber 201 and the film forming chamber 202, silane, phosphine and hydrogen are supplied as material gases from a gas supply pipe 216 and a gas pressure is adjusted to a predetermined level by controlling an opening degree of an exhaust valve (not shown). In this condition, an n-type first semiconductor layer 105 (see FIG. 1) is formed by supplying a predetermined high-frequency power to an opposed electrode 213 for a predetermined time.

After exhausting the material gases, the gate valve 228 is opened between the film forming chamber 202 for a first semiconductor layer and the film forming chamber 203 for a second semiconductor layer, and the substrate 206 is carried under a substrate holder and electrode 211, and the substrate holder and electrode 211 is lowered to hold the substrate 206. The substrate 206 is heated with a heater 208 and maintained at a predetermined temperature. After supplying silane and hydrogen from a gas supply pipe 217 as material gases until a gas pressure reaches a predetermined level, and an i-type second semiconductor layer 106 (see FIG. 1) is formed by supplying a predetermined high-frequency power to an opposed electrode 214 for a predetermined time.

The substrate 206 is moved similarly into the film forming chamber 204 for third semiconductor layer, held by a substrate holder and electrode 212 and heated with a heater 209, and a p-type third semiconductor layer 107 (see FIG. 1) is formed by supplying a power to an opposed electrode 215 while feeding boron, fluoride and silane as material gases from a gas supply pipe 218 and supplying power to an opposed electrode 215, thereby forming the joined semiconductor layers. In FIG. 2, reference numerals 219 through 226 represent gas supply lines. In another vacuum system, a second electrode layer 108 which is made of indium oxide or the like so as to serve also as an antireflection layer is manufactured on the third semiconductor layer.

In this embodiment, as for a ratio of projected areas of regions that have heights not smaller than a center value of the concavities and convexities on a surface to an entire projected area thereof, the case of the shape of a surface of the second semiconductor layer 106 is higher than the case of the shape of a surface of the substrate 101. Shapes of the surfaces of the third semiconductor layer 107 and the second electrode layer 108 which are thin remain nearly unchanged from that of the second semiconductor layer 106.

A photovoltaic device is to be completed by disposing a comb type collector electrode 109, attaching an output electrode (not shown) to the collector electrode 109, bonding a steel sheet and a thin film of fluoride polymer used as a back surface reinforcing member 112 and a front surface film 111, respectively, with a sealing member 110 made of a thermoplastic transparent organic resin, thereby forming a protective member.

The photovoltaic device according to the present invention which is manufactured as described above has a high short-circuit current and an enhanced photoelectric conversion efficiency. Furthermore, the photovoltaic device has characteristics which are scarcely variable for a long time and a reliability which is remarkably improved.

Each component of the photovoltaic device according to the present invention will be described below.

(Substrate)

The substrate 101 comprises a first electrode for taking out electric power from the joined semiconductor layers and may be made of a single material or a plurality of materials. A metal sheet, an alloy sheet, a laminated metal or alloy sheet, a carbon sheet, a resin sheet or the like may be used as the support base member 102. These sheets are suited for successive manufacturing since they can be prepared in rolled forms.

A substrate of crystalline material such as silicon, a glass sheet, a ceramic sheet or the like is usable as the support base member 102 depending on the purposes of use of the photovoltaic device. Furthermore, it is possible to use a transparent substrate made of glass or the like so that light can be incident from a side of the substrate. When a magnetic substance such as a ferrite series stainless steel (SUS 430) is used as the support base member 102, it is possible to carry the support base member 102 while accurately controlling its position with a roller having a built-in magnet.

The support base member 102 can be used with no treatment though its surface may be polished or washed. Usable as the support base member 102 is a material which has concavities and convexities such as stainless steel finished dull with a roller. Furthermore, a nickel, aluminium or steel sheet which has concavities and convexities formed by a surface treatment may be used.

When the support base member 102 has a high reflectance, it is unnecessary to dispose the reflecting layer 103 on the support base member 102. When the support base member 102 is insulating, the reflecting layer may serve also as an electrode layer. When stainless steel sheet or a carbon sheet is used as the support base member 102, it is better to form an aluminium or silver layer on a surface of the support base member by sputtering or the like. Concavities and convexities may be formed on a surface of the reflecting layer 103 by forming it at a high temperature and a low depositing rate to thicken the film thickness or etching the surface after deposition. When light is to be incident from a side of the support base member, it is better to form the reflecting layer on a surface side of the joined semiconductor layers.

The transparent conductive layer 104, which is not always necessary, can be formed, for example, by sputtering, vapor deposition, a chemical vapor phase growth, ion plating, ion beam, ion beam sputtering or the like. Furthermore, the transparent conductive layer 104 can be formed by electric deposition from an aqueous solution containing a nitric acid group, acetic acid group, ammonia group and metal ions or dipping into such a solution.

To allow light to transmit to the reflecting layer 103, it is desirable that the transparent conductive layer 104 has high transparency. Furthermore, it is desirable that the transparent conductive layer 104 has resistance of an adequate degree to restrict a current supplied through a defect of the joined semiconductor layers. Zinc oxide, indium oxide, tin oxide, indium tin oxide (ITO), titanium oxide or a compound containing these is preferably usable as a material for the transparent conductive layer 104. Though concavities and convexities having sizes of several hundred nanometers can be formed by controlling conditions for forming the transparent conductive layer 104, it is possible to form an even layer, and then form concavities and convexities by wet etching with an aqueous solution of acetic acid or the like. When the transparent conductive layer 104 is to be formed by sputtering, it is possible to obtain large concavities and convexities by forming a thick layer while keeping the substrate at a high temperature and a low depositing rate. When the transparent conductive substrate is to be formed by electric deposition from an aqueous solution, large concavities and convexities can be obtained by forming a thick layer at an enhanced metal ion concentration.

Regardless of materials and forming methods, it is desirable for scattering and effective use of incident light with a shape of the joined semiconductor layers to form the substrate 101 so as to have a surface shape having a mean height of 100 to 500 nm, mean center line roughness Ra of 10 to 200 nm and a ratio of 40 to 80% of projected areas of regions that have heights not smaller than a center value of concavities and convexities to an entire projected area.

(Joined semiconductor layers)

A laminated structure of the semiconductor layers 105, 106 and 107 may have, for example, an nip configuration, a pin configuration, a $n^+$ $n^-$ $p^+$ configuration, $n^+$ $p^-$ $p^+$ configuration, $p^+$ $p^-$ $n^+$ configuration or $p^+$ $n^-$ $n^+$ configuration.

It is preferable to supply $PH_3$ or $BH_3$ at 0.1 to 10% of a number of silicon atoms for use as the n-type and p-type doping gases, and at 0.1 to 10 ppm for controlling a small number of valence electrons in the second semiconductor layer. Slight amounts of oxygen, carbon, nitrogen and fluorine may be contained in the joined semiconductor layers.

Figure 3:
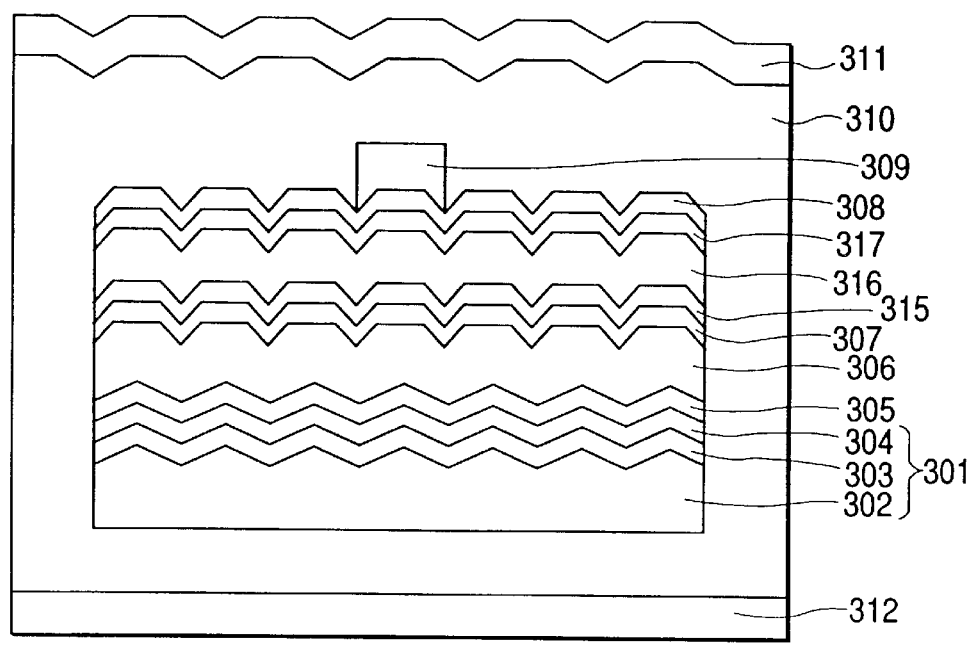
FIG. 3 is a schematic sectional view showing a sectional configuration of another example of the photovoltaic device according to the present invention.

Furthermore, the joined semiconductor layers may be disposed in two or more sets as shown in FIG. 3. In FIG. 3, a reference numeral 301 represents a substrate, a reference numeral 302 designates a support base member, a reference numeral 303 denotes a reflecting layer, a reference numeral 304 represents a transparent conductive layer, a reference numeral 305 designates a first semiconductor layer of a first set, a reference numeral 306 denotes a second semiconductor layer of the first set, a reference numeral 307 represents a third semiconductor layer of the first set, a reference numeral 308 designates a second electrode layer, a reference numeral 309 denotes a collector electrode, a reference numeral 310 represents a sealing member, a reference numeral 311 designates a surface film, a reference numeral 312 denotes a back surface reinforcing member, a reference numeral 315 represents a first semiconductor layer of a second set, a reference numeral 316 designates a second semiconductor layer of the second set and a reference numeral 317 denotes a third semiconductor layer of the second set.

The joined semiconductor layers can be formed by a system other than that shown in FIG. 2. The joined semiconductor layers can be formed in a single vacuum tank while substituting gases or formed successively with a roll-to-roll type system.

In addition, it is preferable that the first semiconductor layer has a thickness of 1 to 50 nm, the second semiconductor layer has a thickness of 500 to 3000 nm and the third semiconductor layer has a thickness of 1 to 50 nm.

(Second electrode layer)

The second electrode layer 108 is a second electrode which is disposed on a side opposite to the substrate to take out electric power from the joined semiconductor layers. It is desirable that the second electrode layer 108 has low resistance and is made, for example, of indium oxide, tin oxide, titanium oxide, zinc oxide, a mixture thereof (for example, indium tin oxide (ITO)) or the like. The second electrode layer 108 can be manufactured by resistive heating, vapor deposition with an electron beam, sputtering, a CVD method, a splight method, a dipping method or the like.

When light is to be incident from a side of the second electrode layer 108, it is preferable for obtaining a favorable antireflection effect that the second electrode layer 108 has a thickness on the order of a quotient of a wavelength of a light to be mainly prevented from being reflected which is divided by a refractive index of the second electrode layer× 4. When the second electrode layer has a refractive index of 2.0 and a light having wavelength of 500 nm is desired to be most transmitted, for example, it is preferable that the second electrode layer 108 has a thickness on the order of approximately 63 nm (500×(1/2.0×4)). The second electrode layer 108 can be composed by laminating materials which have different refractive indices.

The present invention is not limited by the embodiment described above wherein the photovoltaic device is composed by integrally forming the first electrode layer, the joined semiconductor layers and the second electrode layer.

(Collector electrode)

A lattice like collector electrode 109 may be disposed on the second electrode layer 108 for collecting a current effectively. Utilizable as a method to form the collector electrode 109 are the sputtering method, resistive heating method or a CVD method using a mask pattern, a method to form a metal film over an entire surface by deposition and then pattern it by etching to remove unwanted portions, a method to directly form a grid electrode pattern by a light CVD method, a method to form a mask of a negative pattern of a grid electrode and then form a collector electrode by plating, a method to print a conductive paste or a method to thermally bond a copper wire coated with a carbon paste under pressure. To take out an electromotive force, output terminals are attached to the substrate 101 and the collector electrode 109 as occasion demands.

(Sealing member)

The sealing member 110 serves not only to protect the photovoltaic device from external environments such as temperature variations, humidity and shocks but also to bond a surface film 111 to the back surface reinforcing member 112, electrode layer 108 and substrate 101. Therefore, it is preferable that the sealing member 110 is made of a resin which satisfies requirements for weather resistance, adherability, filling property, heat resistance, cold resistance, shock resistance and so on. As resins which satisfy these requirements, there can be mentioned polyolefin resin, urethane resin, silicone resin, fluororesin and so on. Furthermore, it is possible to use an organic peroxide in combination with the sealing member 110 for crosslinking and thermocompression bonding while pressurizing and heating under vacuum. Moreover, it is possible to improve various characteristics by adding a crosslinking auxiliary agent, an ultraviolet light absorber, a light stabilizer, an antioxidant, a silane coupling agent, an organic compound of titanate and so on to the sealing member 110.

In order to minimize reduction of an amount of light to reach the joined semiconductor layers, on the other hand, the sealing member 110 must be transparent. Specifically, transmittance of the sealing member 110 is preferably not lower than 80%, or more preferably not lower than 90%, for light within the visible region from 400 nm to 800 nm. Furthermore, a refractive index of the sealing member 110 at 25 degrees centigrade is preferably 1.1 to 2.0, or more preferably 1.1 to 1.6, to facilitate incidence of light from the atmosphere.

(Surface film)

Fluororesin and acrylic resin, for example, can be utilized as the surface film 111. To improve adherability to the sealing member 110 mentioned above, it is desirable to treat one surface of the surface film 111, for example, with corona, plasma, ozone, ultraviolet light, electron beam or flame. Concavities and convexities may be formed on the surface film 111 and the sealing member 110.

These concavities and convexities may be formed with a press during or after formation of a sheath.

(Back surface reinforcing member)

Nylon, polyethylene terephthalate, a steel sheet, a plastic sheet or an FRP (a plastic material reinforced by glass fiber) sheet can be used as the back surface reinforcing member 112. When the back surface reinforcing member has high mechanical strength, the photovoltaic device (a photovoltaic device integrated with a building material) can be used as a building material such as a roof material.

(Power-generating apparatus)

Figure 4:
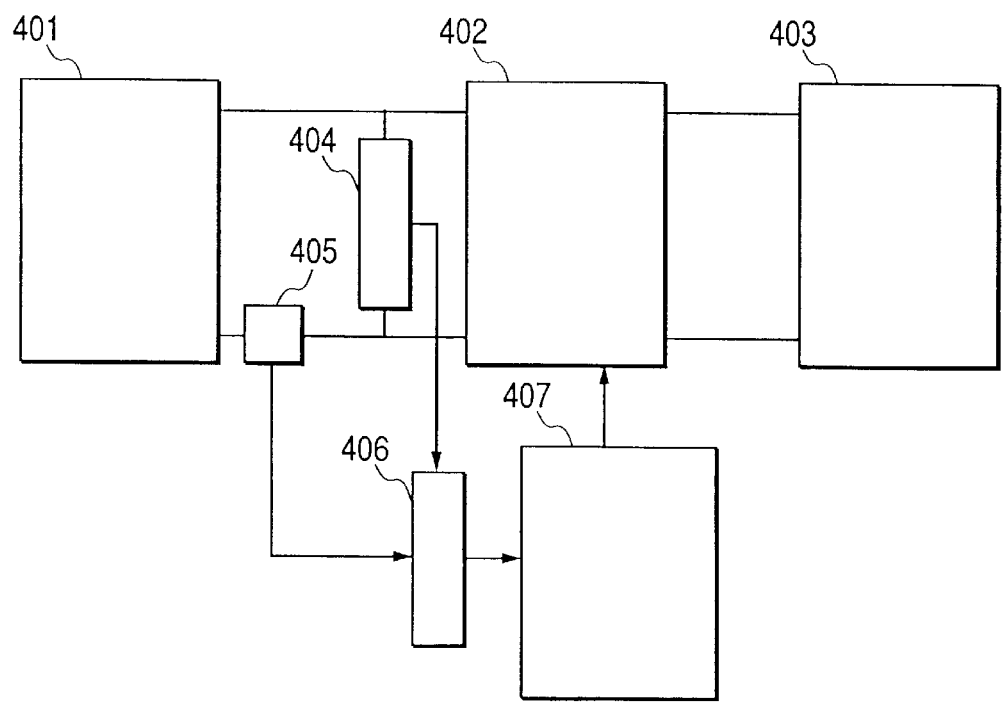
FIG. 4 is a block diagram exemplifying the power-generating apparatus according to the present invention.

FIG. 4 is a block diagram exemplifying a power-generating apparatus which uses the photovoltaic device according to the present invention. As shown in this drawing, DC power generated by a photovoltaic device 401 is input into a power converter 402 and supplied to a load 403 after conversion. An output voltage and an output current from the photovoltaic device 401 are detected by voltage detecting means 404 and current detecting means 405, and detection signals are input into an output setting means 406 so that a control circuit 407 controls the power converter 402 on the basis of signals from the output setting means 406.

The photovoltaic device shown in FIG. 1 or FIG. 3, for example, can be used as the photovoltaic device 401. It is preferable to connect a plurality of photovoltaic devices in series or parallel to obtain a desired voltage and a desired current.

Usable as the power converter 402 are, for example, a DC/DC converter that uses a self arc-suppression type switching element such as power transistor, power FET or IGBT, or a self-excited DC/AC inverter. The power converter 402 is capable of controlling a power flow, an input/output voltage, an output frequency, etc. depending on ON/OFF duty ratios (the so-called conduction ratio) of gate pulses sent from the control circuit 407.

The load 403 may be of any one of various kinds of loads, for example, an electric heating load or an electromotive load. It may be a commercial AC system in case of an AC power. A secondary battery may similarly be used as a DC load. In this case, it is desirable to sufficiently enlarge a capacity of the secondary battery and control a charged condition of the battery. When a DC load is connected, a DC/DC converter is used as the power converter 402.

The voltage detecting means 404 converts an output voltage from the photovoltaic device 401 into a digital value by dividing it with resistors, for example, and sends the digital value to the output setting means 406. In order to avoid noise mixture at this stage, it is desirable to insulate an output circuit for the photovoltaic device 401 from a transmission circuit for the detection signals with a photocoupler or the like that can assure perfect insulation between input and output.

The current detecting means 405 converts a current into a voltage, for example, with a Hall element or a standard resistor and sends, like the voltage detecting means 404, a detection signal as a digital value to the output setting means 406. It is preferable that A/D converters used in these detecting means have sufficiently fast speeds and high precisions, specifically resolution not lower than 10 bits and a sampling speed not lower than 50 kHz. Such A/D converters can compose a control system which involves errors not exceeding 0.1% and has response time not longer than 1 second.

The output setting means 406 determines an output setting value by performing calculations on the basis of the detection signals described above and controls a conduction ratio, etc. of a gate circuit so that the output voltage from the photovoltaic device 401 has a set value. The output setting means 406 can be configured specifically as a microcomputer for control which is equipped with a CPU, a RAM, a ROM, an input/output boat, an arithmetic unit, etc.

The control circuit 407 is the so-called gate driving circuit that generates gate pulses by instantaneous current value comparison or sinusoidal wave/triangular wave comparison or the like. These gate pulses are used to control the power converter 402 so that the output voltage from the photovoltaic device 401 matches with an output from the output setting means 406. The control circuit 407 may be composed of analog circuits or digital circuits. In recent days, however, this circuit is mostly composed of digital circuits, and equipped with a CPU and a DSP (digital signal processor) which is a high-speed CPU. The control circuit 407 that is composed of the digital circuits has a configuration similar to that of the output setting means 406 described above, and can use a circuit functioning as both the control circuit and the output setting means.

EXAMPLES

Now, description will be made of examples which are not limitative of the present invention.

Example 1

In Example 1, the photovoltaic device that has the sectional configuration schematically shown in FIG. 1 was manufactured in plurality under the same conditions, with manufacturing of some of the photovoltaic devices being stopped during the manufacturing process as required for evaluations.

Used as the support base member 102 was a sheet of SUS430 of 45 mm long×45 mm wide×0.15 mm thick, which was concaved and convexed by the so-called dull finish. The support base member 102 was disposed in a commercially available DC magnetron sputtering apparatus which was evacuated to a pressure not exceeding $10^{-5}$ Torr. Then, 30 sccm of argon gas was supplied and the pressure was maintained at 2 mTorr. A reflecting layer 103 of aluminium 70 nm thick was formed by applying a DC power of 120 W for 90 seconds to an aluminium target having a diameter of 6 inches without heating the support base member. Successively, the support base member was heated to 300° C. and a transparent conductive layer 104 of zinc oxide approximately 3000 nm thick was formed on the transparent conductive layer 103 by replacing the aluminium target with a zinc oxide target having a diameter of 6 inches and applying a DC power of 500 W for 30 minutes. A substrate 101 was manufactured in this way.

Measurements of a surface shape of the substrate with an atomic force microscope (Q scope 250 manufactured by Quesant, Ltd. in the U.S.A.) using a probe having a tip radius of 20 nm, a point angle of 36 degrees and a length of 200 nm clarified that the surface had a mean height of 300 nm and a mean centerline roughness Ra of 80 nm, and that a ratio of projected ares of regions that had heights not smaller than a center values of concavities and convexities to a projected area of the entire surface was 50%.

After the substrate was placed in the feeding chamber 201 of the system schematically shown in FIG. 2 and the chamber was evacuated to $10^{-4}$ Torr with a vacuum pump, the gate valve 227 was opened between the feeding chamber 201 and the film forming chamber 202 for the first semiconductor layer, and the substrate was moved into the film forming chamber 202 for the first semiconductor layer. The substrate holder 210 was lowered to set a spacing of 30 mm between the electrodes, and a surface temperature of the substrate was controlled to 250° C. with the heater 207.

After evacuation was sufficiently conducted, $SiH_4/H_2$ ($SiH_4$ diluted to 10% with $H_2$), $PH_3/H_2$ ($PH_3$ deluted to 2% with $H_2$) and $H_2$ were introduced at 4 sccm, 1 sccm and 100 sccm, respectively, from the gas supply pipe 216, and a pressure in the film forming chamber 202 was maintained at 1 Torr by adjusting an opening degree of the throttle valve. Upon stabilization of the pressure, a power of 15 W was supplied to the electrode 213 from a high-frequency power source of 105 MHz. Plasma was continued for 360 seconds. Accordingly, an n-type first semiconductor layer 105 approximately 20 nm thick was formed on the transparent conductive layer 104.

After evacuation once again, the substrate was moved into the film forming chamber 203 for the second semiconductor layer and the spacing between the electrodes was set at 30 mm, the substrate was set at a temperature of 250° C., $SiH_4$ and $H_2$ were introduced at 50 sccm and 1500 sccm, respectively, from the gas supply pipe 217, and an opening degree of the throttle valve was adjusted to maintain a pressure of 300 mTorr in the film forming chamber 203. Upon stabilization of the pressure, a power of 5 W was supplied to the electrode 214 from the high-frequency power source of 105 MHz and a power of 8 W having a high frequency of 13.56 MHz was applied to a bias electrode (not shown) for 120 minutes. An i-type second semiconductor layer 106 approximately 1000 nm thick was formed accordingly.

After evacuation again, the substrate was moved into the film forming chamber 204 for the third semiconductor layer. While maintaining the substrate at 170° C., $SiH_4/H_2$ ($SiH_4$ diluted to 10% with $H_2$), $BF_3/H_2$ ($BF_3$ diluted to 2% with $H_2$) and $H_2$ were introduced at 0.2 sccm, 1 sccm and 35 sccm, respectively, from the gas supply pipe 218, and an opening degree of the throttle valve was adjusted to maintain a pressure of 2 Torr in the film forming chamber 204. Upon stabilization of the pressure, a power of 33 W was supplied to the electrode 215 from a high-frequency power source of 13.56 MHz. Plasma was continued for 150 seconds. Accordingly, a p-type third semiconductor layer 107 approximately 10 nm thick was formed.

Each of the layers was formed in adequate conditions, and its thickness was determined in terms of time from a result obtained by measuring a step formed by mechanical peeling of a portion of film with a probe type thickness gauge.

Measurements of a surface shape with the atomic force microscope mentioned above indicated a mean height of 350 nm, a mean centerline roughness Ra of 100 nm and a ratio 60% of projected areas of regions that had heights not smaller than a center value of concavities and convexities to an entire projected area, which was higher than that on the surface of the substrate. A surface of a sample on which the layers only up to the second semiconductor layer 106 were measured for confirmation and this measurement indicated values which were quite the same as those obtained from the third semiconductor layer 107. Needless to say, it is preferable to form the joined semiconductor layers successively for manufacturing an element which is to be used as a photovoltaic device without interrupting for evaluation.

Furthermore, a measurement of the sample having only the layers up to the second semiconductor layer with an X-ray diffraction apparatus RINT 2000 prepared by Rigaku Electric Corp. indicated a peak of the (220) surface of silicon. Furthermore, a measurement with a Raman Spectrometer NRS-2000C prepared by Japan Spectrum Corp. permitted observing a peak at 520 $cm^{-1}$, whereby each of the measurements allowed to confirmation that the joined semiconductor layers of the present example contained a crystalline phase.

Then, the sample was placed on a surface of an anode of a DC magnetron sputtering apparatus and surroundings of the sample were shielded, with a surrounding mask made of a stainless steel. With the sample kept in this condition, a second electrode layer 108 was formed in a central region measuring 40 mm×40 mm by sputtering using an ITO target made of 10% by weight of tin oxide and 90% by weight of indium oxide. To form the second electrode layer 108 having a thickness of approximately 70 nm, selected depositing conditions were: a substrate temperature of 170° C., a flow rate for argon gas as an inert gas of 50 sccm, a flow rate of oxygen gas of 0.5 sccm, a pressure in a depositing chamber of 3 mTorr, and electric power supply to a unit area of a target of 0.2 $W/cm^2$ for approximately 100 seconds. The relationship between film thickness and deposition time was preliminarily calibrated in the same conditions to obtain layers that had predetermined thicknesses. Measurements of a surface shape of the second electrode layer 108 also indicated values which were quite the same as those of the surface of the third semiconductor layer.

After forming a collector electrode 109 within a region of 2% of an area of the second electrode layer 108 by silk screening a silver paste onto the sample that was prepared as described above, an output terminal was attached, a copper tab was attached as a negative side terminal to the support base member 102 using a stainless solder, and a tin foil tape was finally attached as a positive side terminal to the collector electrode 109 with a conductive bonding agent. The positive side terminal is turned to the back surface by way of an insulating material so that an output could be taken through a hole formed in the back surface reinforcing member.

In this condition, a voltage/current characteristic during irradiation with AM 1.5 (100 $mW/cm^2$) provided a short-circuit current of 26 $mA/cm^2$ and an initial conversion efficiency of 8.2%. Furthermore, a conversion efficiency was 8.2% after a continuous irradiation test for 1000 hours.

Subsequently, an EVA sheet as the sealing member 110 (Photocap by trade name prepared by Springborn Laboratory, Ltd., 460 micrometers thick) and a non-extensible ETFE film treated with corona discharge on a surface thereof (Tefzel Film by trade name prepared by Du Pont, Ltd., 50 micrometers thick) were overlapped on a side of a light receiving surface of the photovoltaic device, and an EVA sheet as a sealing member 110' (Photocap by trade name prepared by Springborn Laboratory, Ltd., 460 micrometers thick), a nylon film (Dartec by trade name prepared by Du Pont, Ltd., 63.5 micrometers thick) and a galvanized steel sheet as the back surface reinforcing member 112 (zinc-plated steel sheet, 0.27 mm thick) were overlapped on the back side in an order of ETFE/ EVA/ photovoltaic device/EVA/nylon/EVA/steel sheet. At this step, an aluminium mesh (16×18 mesh, wire diameter 0.011 inch) was disposed by way of a teflon film (Teflon PFA film by trade name prepared by Du Pont, Ltd., 50 micrometers thick) for releasing the EVA extruding from the ETFE. By heating a laminated body thus obtained at 150° C. for 30 minutes while pressuring and deaerating, a photovoltaic device having concavities and convexities which were formed on a surface thereof with the aluminium mesh was obtained.

The EVA sheet used here is widely used as a sealing member for solar cells and prepared by blending 100 weight parts of an EVA resin (containing 33% of vinyl acetate) with 1.5 weight part of a crosslinking agent, 0.3 weight part of an ultraviolet light absorber, 0.1 weight part of a light stabilizer, 0.2 weight part of antioxidant and 0.25 weight part of a silane coupling agent. The output terminal was preliminarily turned to the back surface so that an output can be taken through a terminal outlet preliminarily formed in the galvanized steel sheet after the lamination and completed by bonding a protective resin.

After disposing the protective resin, a voltage/current characteristic during irradiation with A.M. 1.5 (100 $mW/cm^2$) provided a short-circuit current of 25 $mA/cm^2$ and an initial conversion efficiency of 7.8%. After a deterioration test for 1000 hours under irradiation with A.M. 1.5 (100 $mW/cm^2$), the conversion efficiency of 7.8% remained unchanged. An environmental test was effected by accommodating this sample in an environmental test box kept at a temperature of 85° C. and a humidity of 85% for 1000 hours. The test indicated no problem since the conversion efficiency was degraded only 0.02%.

Comparative Example 1-1

As Comparative Example 1-1, a sample was manufactured in the same procedures as those in Example 1, except for a substrate temperature which was set at 400° C., $SiH_4$ and $H_2$ which were introduced from the gas supply pipe 217 at flow rates of 80 sccm and 1500, sccm respectively, a pressure in a reaction vessel which was maintained at 30 mTorr by adjusting an opening degree of the throttle valve, a power of 50 W which was supplied from a high-frequency power source of 500 MHz upon stabilization of the pressure and a high-frequency power of 20 W at 13.56 MHz which was applied to the bias electrode (not shown) for 40 minutes.

Measurements of a surface shape of this sample with an atomic force microscope indicated a mean height of 300 nm, a mean centerline roughness Ra of 110 nm and a ratio 20% of projected areas of regions that had heights not smaller than a center value of concavities and convexities to an entire projected area, which was lower than a ratio 50% on a surface of the substrate.

After forming a protective resin layer, a voltage/current characteristic during irradiation with A.M. 1.5 (100 $mW/cm^2$) provided a low short-circuit current of 13 $mA/cm^2$ and a low conversion efficiency of 5.6%. After a deterioration test effected by irradiation with AM 1.5 (100 $mW/cm^2$) for 1000 hours, a conversion efficiency was 5.1% and degraded.

A measurement of a sample on which only the layers up to the second semiconductor layer were formed with an X-ray diffraction apparatus provided a result wherein the peak of silicon was not observed. Furthermore, a measurement with Raman spectrometer provided a result wherein only a gentle peak was observed at 480 cm$^{-1}$, whereby both the measurements allowed to confirm that the second semiconductor layer was in an amorphous phase.

Comparative Example 1-2

As Comparative Example 1-2, a sample was manufactured in the same procedures as those in Example 1, except for at the step to form the second semiconductor layer, a substrate temperature which was set at 350° C., SiH$_4$ and H$_2$ which were introduced at 25 sccm and 750 sccm, respectively, from the gas supply pipe 217, a pressure which was maintained at 300 mTorr in the reaction vessel by adjusting the throttle valve, and a power of 10 W which was applied for 120 minutes from the high-frequency power source of 105 MHz upon stabilization of the pressure.

Measurements of a surface shape of this sample with an atomic force microscope indicated a mean height of 30 nm, a mean centerline roughness Ra of 80 nm and a ratio 50% of projected areas of regions that had heights not smaller than a center value of concavities and convexities to an entire projected area, which was the same as a ratio of 50% on a surface of a substrate.

After forming a protective resin layer, a voltage/current characteristic during irradiation with AM 1.5 (100 mW/cm$^2$) provided a short-circuit current of 24 mA/cm$^2$ and a low initial conversion efficiency of 6.2%.

A measurement of a sample having the layers up to the second semiconductor layer with an X-ray diffraction apparatus allowed a peak of the (220) surface to be observed and a measurement with a Raman spectrometer provided a peak at 518 cm$^{-1}$, whereby both measurements allowed to confirmation that the second semiconductor layer contained a crystalline phase. Therefore, a ratio of projected areas of regions having heights not smaller than a center value of concavities and convexities to an entire projected area on a surface of a semiconductor layer which is higher than that on a surface of a substrate is more important than whether or not a photovoltaic device contains a crystalline phase.

Example 2

In Example 2 also, a photovoltaic device which had the sectional configuration schematically shown in FIG. 1 was manufactured in plurality under the same conditions, with manufacturing of some photovoltaic devices being stopped during the manufacturing process as required for evaluations.

Used as the support base member 102 was a sheet of SUS 430 which measured 45 mm long×45 mm wide×0.15 mm thick and which was made flat by the so-called BA finish. After disposing the support base member 102 in a commercially available DC magnetron sputtering apparatus, a reflecting layer 103 and a transparent conductive layer 104 70 nm and 100 nm thick, respectively, were formed using the same procedures as those in Example 1. Using the support base member 102 and a zinc sheet as a negative electrode and a positive electrode, respectively, electric deposition was effected at a temperature of 80° C. and a current density of 4 mA/cm$^2$ in an aqueous solution of zinc nitrate at 0.05 mol/liter for 5 minutes. Accordingly, a zinc oxide film (transparent conductive layer) approximately 1000 nm thick was newly formed on the transparent conductive layer that had been formed by the sputtering.

Measurements of a surface shape of the substrate thus manufactured with an atomic force microscope indicated a mean height of 30 nm, a mean centerline roughness Ra of 2 nm and a ratio 50% of projected areas of regions having heights not smaller than a center value of concavities and convexities to an entire projected area.

After immersing this substrate in a 5% aqueous solution of acetic acid at 35° C. for 30 seconds, measurements of the surface shape indicated a mean height of 180 nm, a mean centerline roughness Ra of 40 nm and a ratio 46% of projected areas of regions having heights not smaller than a center value of concavities and convexities to an entire projected area.

After the substrate immersed into the aqueous solution of the acetic acid was placed in the feeding chamber 201 of the system schematically shown in FIG. 2 and the chamber was evacuated to 10$^{-4}$ Torr with a vacuum pump, the gate valve 227 was opened between the feeding chamber 201 and the film forming chamber 202 for the first semiconductor layer, and the substrate was moved into the film forming chamber 202 for the first semiconductor layer. A spacing between the electrodes was set at 10 mm by lowering the substrate holder 210 and a temperature on a surface of the substrate was controlled to 225° C. with the heater 207.

After evacuation was conducted sufficiently, SiH$_4$/H$_2$ (SiH$_4$ diluted to 10% with H$_2$), PH$_3$/H$_2$ (PH$_3$ diluted to 2% with H$_2$) and H$_2$ were introduced at 4 sccm, 0.5 sccm and 100 sccm, respectively, from the gas supply pipe 216, and a pressure was maintained at 1 Torr in the film forming chamber 202 by adjusting an opening degree of the throttle valve. Upon stabilization of the pressure, a power of 15 W was supplied to the electrode 213 from the high-frequency power source of 105 MHz. Plasma was continued for 390 seconds. Accordingly, an n-type first semiconductor layer 105 approximately 20 nm thick was formed on the transparent conductive layer 104.

After evacuation once again, the substrate was moved into the film forming chamber 203 for the second semiconductor layer, a spacing between the electrodes was set at 10 mm, then the substrate was set at a temperature of 250° C., SiH$_4$ and H$_2$ were introduced at 25 sccm and 750 sccm, respectively, from the gas supply pipe 217, and a pressure was maintained at 300 mTorr in the film forming chamber 203 by adjusting an opening degree of the throttle valve. Upon stabilization of the pressure, a power of 4 W was supplied to the electrode 214 for 120 minutes from the high-frequency power source of 105 MHz. Accordingly, an i-type second semiconductor layer 106 approximately 1000 nm thick was formed.

After evacuation again, the substrate was moved into the film forming chamber 204 for the third semiconductor layer and set at a temperature of 170° C., SiH$_4$/H$_2$ (SiH$_4$ diluted to 10% with H$_2$), BF$_3$/H$_2$ (BF$_3$ diluted to 2% with H$_2$) and H$_2$ were introduced at 0.2 sccm, 1 sccm and 35 sccm, respectively, from the gas supply pipe 218, and a pressure was maintained at 2 Torr in the film forming chamber 204 by adjusting an opening degree of the throttle valve. Upon stabilization of the pressure, a power of 33 W was supplied to the electrode 215 from the high-frequency power source of 13.56 MHz. Plasma was continued for 150 seconds. Accordingly, a p-type third semiconductor layer 107 approximately 10 nm thick was formed.

Measurements of a surface shape of this sample with an atomic force microscope indicated a mean height of 250 nm, a mean centerline roughness Ra of 60 nm and a ratio 56% of projected areas of regions having heights not smaller than a center value of concavities and convexities to an entire projected area, which was higher than that on the surface of the substrate. A surface of a sample on which only the layers up to the second semiconductor layer were formed was measured for confirmation, and these measurements indicated values which were quite the same as those on the surface of the third semiconductor layer.

A measurement of the sample on which only the layers up to the second semiconductor layer were formed which was effected with an X-ray diffraction apparatus, allowed observation a peak of the (220) surface of silicon. Furthermore, a measurement with a Raman spectrometer provided a result wherein a peak lower than that in Example 1 was observed at 518 cm$^{-1}$, thereby allowing to confirm that the joined semiconductor layers in this Example 2 contained a crystalline phase.

Thereafter, a photovoltaic device was manufactured in the same procedures as those in Example 1.

After forming a protective resin layer, voltage/current characteristics during irradiation with A.M. 1.5 (100 mW/cm$^2$) provided a short-circuit current of 26 mA/cm$^2$ and an initial conversion efficiency of 7.9%. After a deterioration test for 1000 hours at AM 1.5 (100 mW/cm$^2$), a conversion efficiency was 7.8%, or substantially unchanged. The conversion efficiency was scarcely degraded though Raman peak representing crystallizability was low.

Furthermore, an environmental test was effected by accommodating this sample for 1000 hours in an environmental test box kept at a temperature of 85° C. and a humidity of 85%. The sample was not problematic since the test indicated a conversion efficiency degradation only of 0.01%.

Example 3

In Example 3, a plurality of photovoltaic devices which had the sectional configuration schematically shown in FIG. 3 were manufactured under the same conditions, manufacturing of some photovoltaic devices being stopped during the manufacturing process as required for evaluations.

Used as the support base member 302 was a steel sheet which was plated with nickel to form concavities and convexities. After placing the support base member 302 in a commercially available DC magnetron sputtering apparatus, a reflecting layer 303 and a transparent conductive layer 304 were formed in the same procedures as those in Example 1 so as to have thicknesses of 70 nm and 100 nm, respectively.

Measurements of a surface shape of a substrate with an atomic force microscope indicated a mean height of 150 nm, a mean centerline roughness Ra of 15 nm and a ratio 58% of projected areas of regions having heights not smaller than a center value of the concavities and convexities to an entire projected area.

After placing the substrate in the feeding chamber 201 of the system shown in FIG. 2 and evacuating the chamber to 10$^{-4}$ Torr with a vacuum pump, the gate valve 227 was opened between the feeding chamber 201 and the film forming chamber 202 for the first semiconductor layer, and the substrate 206 was moved into the film forming chamber 202 for the first semiconductor layer. The substrate holder 210 was lowered to set a spacing of 30 mm between the electrodes and a surface temperature of the substrate was controlled to 250° C. with the heater 207. After evacuation was conducted sufficiently, SiH$_4$/H$_2$ (SiH$_4$ diluted to 10% with H$_2$), PH$_3$/H$_2$ (PH$_3$ diluted to 2% with H$_2$) and H$_2$ were introduced at 4 sccm, 1 sccm and 100 sccm, respectively, from the gas supply pipe 216, and a pressure was maintained at 1 Torr in the reaction vessel by controlling an opening degree of the throttle valve. Upon stabilization of the pressure, a power of 15 W was supplied to the electrode 213 from the high-frequency power source of 105 MHz. Plasma was continued for 36 seconds. Accordingly, an n-type first semiconductor layer 305 approximately 20 nm thick was formed on the transparent conductive layer 304.

After evacuation once again, the substrate was moved into the film forming chamber 203 the second semiconductor layer. After adjusting a distance between the electrodes to 30 mm, SiH$_4$ and H$_2$ were introduced at 50 sccm and 1500 sccm, respectively, from the gas supply pipe 217 with the substrate kept at 250° C., and a pressure was maintained at 300 mTorr in the film forming chamber 203 by adjusting the throttle valve. Upon stabilization of the pressure, a power of 5 W was supplied to the electrode 214 from the high-frequency power source of 105 MHz and a high-frequency power of 8 W at 13.56 MHz was applied to the bias electrode for 120 minutes. Accordingly, an i-type second semiconductor layer 306 approximately 1000 nm thick was formed.

After evacuation again, the substrate was moved into the film forming chamber 204 for the third semiconductor layer. With the substrate kept at 200° C., SiH$_4$/H$_2$ (SiH$_4$ diluted to 10% with H$_2$), BF$_3$/H$_2$ (BF$_3$ diluted to 2% with H$_2$) and H$_2$ were introduced at 0.2 sccm, 1 sccm and 35 sccm, respectively, from the gas supply pipe 218, and a pressure was maintained at 2 Torr in the film forming chamber 204 by adjusting an opening degree of the throttle valve. Upon stabilization of the pressure, a power of 33 W was supplied to the electrode 215 from the high-frequency power source of 13.56 MHz. Plasma was continued for 150 seconds. Accordingly, a p-type third semiconductor layer 307 approximately 10 nm thick was formed.

When a part of the substrate was taken out of the system at this stage, measurements of its surface shape with an atomic force microscope indicated a mean height of 180 nm, a mean centerline roughness Ra of 30 nm and a ratio of 69% of projected areas of regions having heights not smaller than a center value of concavities and convexities to an entire projected area.

A measurement with an X-ray diffraction apparatus of a sample on which only the layers up to the second semiconductor layer were formed an provided a result wherein a peak of the (220) surface of silicon was observed. Furthermore, a measurement with a Raman spectrometer provided a result wherein a peak was observed at 516 cm$^{-1}$, thereby allowing confirmation that the joined semiconductor layers according to the present Example contained a crystalline phase.

A substrate which was not measured was moved again into the film forming chamber 202 for the first semiconductor layer. After lowering the substrate holder 210 to set a spacing of 30 mm between the electrodes, a surface temperature of the substrate was controlled to 230° C. with the heater 207.

After sufficient evacuation, SiH$_4$/H$_2$ (SiH$_4$ diluted to 10% with H$_2$), PH$_3$/H$_2$ (PH$_3$ diluted to 2% with H$_2$) and H$_2$ were introduced at 1 sccm, 2.5 sccm and 48 sccm, respectively, from the gas supply pipe 216, and a pressure was maintained at 1 Torr in the film forming chamber 202 by adjusting an opening degree of the throttle valve. Upon stabilization of the pressure, a power of 1.5 W was supplied to the electrode 213 from the high-frequency power source of 13.56 MHz. Plasma was continued for 60 seconds. Accordingly, an n-type semiconductor layer approximately 20 nm thick was formed on the third semiconductor layer 307.

After evacuation once again, the substrate was moved into the film forming chamber 203 for second semiconductor layer. After adjusting the distance between the electrodes to 30 mm, the substrate was set at a temperature of 250° C., $Si_2H_6$ and $H_2$ were introduced at 1 sccm and 48 sccm, respectively, from the gas supply pipe 217, and a pressure was maintained at 1 Torr in the film forming chamber 203 by adjusting an opening degree of the throttle valve. Upon stabilization of the pressure, a power of 1.5 W was supplied for 20 minutes from the high-frequency power source of 13.56 MHz. Accordingly, an i-type semiconductor layer 316 approximately 250 nm thick was formed.

After evacuation again, the substrate was moved into the film forming chamber 204 for the third semiconductor layer. With the substrate set at a temperature of 170° C., $SiH_4/H_2$ ($SiH_4$ diluted to 10% with $H_2$), $BF_3/H_2$ ($BF_3$ diluted to 2% with $H_2$) and $H_2$ were introduced at 0.2 sccm, 1 sccm and 35 sccm, respectively, from the gas supply pipe 218, and a pressure was maintained at 2 Torr in the film forming chamber 204 by adjusting an opening degree of the throttle valve. Upon stabilization of the pressure, a power of 33 W was supplied from the high-frequency power source of 13.56 MHz. Plasma was continued for 150 seconds. Accordingly, a p-type semiconductor layer 317 approximately 10 nm thick was formed.

Subsequently, a photovoltaic device was manufactured using the procedures similar to those in Example 1.

After forming a protective resin layer, voltage/current characteristics during irradiation with A.M. 1.5 (100 mW/cm²) provided a short-circuit current of 13 mA/cm² and an initial conversion efficiency of 14.0%. After a deterioration test for 1000 hours at A.M. 1.5 (100 mW/cm²), a conversion efficiency was 13.4%, indicating a variation of about −5%.

Furthermore, an environmental test was effected by accommodating this sample for 1000 hours in an environmental test box kept at a temperature of 85° C. and a humidity of 85%. The sample was not problematic at all since its conversion efficiency was degraded only 0.01%.

As understood from the foregoing description, according to the present invention, a ratio of projected areas of regions of joined semiconductor layers that have heights not smaller than a center value of concavities and convexities on a surface of the joined semiconductor layers to an entire projected area is made higher than a ratio of projected areas of regions of a substrate that have heights not smaller than a center value of concavities and convexities on a surface of the substrate to an entire projected area of the substrate, thereby being capable of generating a large amount of current with thin joined semiconductor layers and of producing a photovoltaic device having a high photoelectric conversion efficiency at a low temperature and a low cost. This electrovoltaic device is capable of maintaining a nearly constant conversion efficiency even during use for a long term of 10 to 20 years and has a high reliability.

Furthermore, the present invention makes it possible to manufacture a photovoltaic device integrated with a building material which is suited for use as a roof material or the like by disposing a back surface reinforcing member having excellent mechanical strength on a back surface of the photovoltaic device according to the present invention.

Moreover, the present invention makes it possible to utilize the photovoltaic device described above for providing a power-generating apparatus excellent in a photoelectric conversion effect thereof by producing the power-generating apparatus with an electric power converter into which power is input from the photovoltaic device, detecting means which detects output voltage and output current from the photovoltaic device, output setting means into which detection signals are input from the detecting means and control circuit which controls the electric power converter on the basis of the signal input into the output setting means.

What is claimed is:

1. A method of manufacturing a photovoltaic device comprising:
   depositing joined semiconductor layers on a substrate; and
   forming concavities and convexities on the surface of the substrate and the surface of the joined semiconductor layers such that the substrate has a substantially planar surface with
   (a) a highest point, and
   (b) a lowest point, such that
      (i) a substrate center value that is the mean elevation between said highest point and said lowest point can be determined,
      (ii) a total, $TA_{sub\text{-}above}$, of projected areas of regions of the substrate surface that lie at or above the substrate center value is determined, each said projected area being the cross-sectional area of a columnar projection extending perpendicular from the region, and
      (iii) a total, $TA_{sub\text{-}entire}$, of the projected area of the entire substrate surface is determined;
   and the joined semiconductor layers have a substantially planar surface with
   (c) a highest point, and
   (d) a lowest point, such that
      (iv) a semiconductor center value that is the mean elevation between said highest point and said lowest point is determined,
      (v) a total, $TA_{semi\text{-}above}$, of projected areas of regions of the surface of the joined semiconductor layers that lie at or above the semiconductor center value is determined, each projected area being the cross-sectional area of a columnar projection extending perpendicular from the region, and
      (vi) a total, $TA_{semi\text{-}entire}$, of the projected area of the entire surface of the joined semiconductor layers is determined; and
      wherein the ratio of $TA_{semi\text{-}above}$ to $TA_{semi\text{-}entire}$ is greater than the ratio of $TA_{sub\text{-}above}$ to $TA_{sub\text{-}entire}$.

2. The manufacturing method according to claim 1, wherein the ratio of $TA_{semi\text{-}above}$ to $TA_{semi\text{-}entire}$ is made 10% or more greater than the ratio of $TA_{sub\text{-}above}$ to $TA_{sub\text{-}entire}$.

3. The manufacturing method according to claim 1, wherein the joined semiconductor layers comprise a first semiconductor layer selected from the group consisting of n-type and p-type semiconductor layers, a second semiconductor layer selected from the group consisting of weak n-type, weak p-type and i-type semiconductor layers and a third semiconductor layer which is different from the first semiconductor layer and is selected from the group consisting of n-type and p-type semiconductor layers.

4. The manufacturing method according to claim 3, wherein the i type semiconductor layer is formed so as to contain a microcrystalline semiconductor.

5. The manufacturing method according to claim 3, wherein a quotient of a short-circuit current under sunlight of A.M. 1.5 (100 mW/cm²) divided by a thickness of the second semiconductor layer is made 20 mA/cm²/µm or higher.

6. The manufacturing method according to claim 1, wherein a first electrode layer is provided in the substrate and wherein a second electrode layer is formed on the joined semiconductor layers.

7. The manufacturing method according to claim 1, wherein a mean height of the surface of the substrate is 100 to 150 nm and a mean centerline roughness Ra of the surface of the substrate is 100 to 200 nm, and wherein the ratio of $TA_{sub-above}$ to $TA_{sub-entire}$ is 40 to 80%.

8. The manufacturing method according to claim 1, wherein the substrate comprises at least one metal selected from the group consisting of stainless steel, silver, iron, nickel and aluminum.

9. The manufacturing method according to claim 1, wherein a transparent conductive layer comprising at least one oxide selected from the group consisting of zinc oxide, tin oxide, indium oxide and titanium oxide is formed on the surface of the substrate.

10. The manufacturing method according to claim 9, wherein the transparent conductive layer is formed by sputtering or electric deposition from an electrolyte.

11. The manufacturing method according to claim 1, wherein the concavities and convexities are formed on the surface of the substrate by dry etching or wet etching.

12. The manufacturing method according to claim 1, wherein at least a part of the joined semiconductor layers comprises silicon, hydrogen and a crystalline phase, the crystalline phase exhibiting a peak at 510 to 530 cm$^{-1}$ when analyzed by Raman spectroscopy using a laser beam of 514.5 nm.

13. The manufacturing method according to claim 1 wherein two or more sets of the joined semiconductor layers are formed on the substrate, each set comprising a first semiconductor layer selected from the group consisting of n-type and p-type semiconductor layers, a second semiconductor layer selected from the group consisting of weak n-type, weak p-type and i-type second semiconductor layers and a third semiconductor layer which is different from the first semiconductor layer and is selected from the group consisting of n-type and p-type semiconductor layers.

14. The manufacturing method according to claim 13, wherein a quotient of a short-circuit current under sunlight of A.M. 1.5 (100 mW/cm$^2$) divided by a thickness of the second semiconductor layer is made 20 mA/cm$^2$/µm or higher.

15. The manufacturing method according to claim 13, wherein at least one layer of the i-type semiconductor layers is formed so as to contain a microcrystalline semiconductor.

16. A method of manufacturing a photovoltaic device comprising:
    depositing joined semiconductor layers on a substrate; and
    forming concavities and convexities on the surface of the substrate and the surface of the joined semiconductor layers such that the substrate has a substantially planar surface with
    (a) a highest point, and
    (b) a lowest point, such that
        (i) a substrate center value that is the mean elevation between said highest point and said lowest point can be determined,
        (ii) a total, $TA_{sub-above}$, of projected areas of regions of the substrate surface that lie at or above the substrate center value can be determined, each said projected area being the cross-sectional area of a columnar projection extending perpendicular from the region, and
        (iii) a total, $TA_{sub-entire}$, of the projected area of the entire substrate surface can be determined;
    and the joined semiconductor layers have a substantially planar surface with
    (c) a highest point, and
    (d) a lowest point, such that
        (iv) a semiconductor center value that is the mean elevation between said highest point and said lowest point can be determined,
        (v) a total, $TA_{sub-above}$, of projected areas of regions of the surface of the joined semiconductor layers that lie at or above the semiconductor center value can be determined, each projected area being the cross-sectional area of a columnar projection extending perpendicular from the region, and
        (vi) a total, $TA_{semi-entire}$, of the projected area of the entire surface of the joined semiconductor layers can be determined; and
        wherein the ratio of $TA_{semi-above}$ to $TA_{semi-entire}$ is greater than the ratio of $TA_{sub-above}$ to $TA_{sub-entire}$,
    wherein at least a part of the joined semiconductor layers is formed by a plasma CVD method, in which SiH$_4$ diluted to 5% or less with H$_2$ as a raw material gas and a high-frequency power of 50 to 550 MHz with a power density of 0.05 to 1.0 W/cm$^3$ are supplied at a temperature of 150 to 300° C. and a pressure of 0.02 to 0.5 Torr.

17. The manufacturing method according to claim 16, wherein the high-frequency power is supplied from electrodes opposed to the substrate with a spacing not exceeding 50 mm kept between the electrodes.

* * * * *

UNITED STATES PATENT AND TRADEMARK OFFICE
CERTIFICATE OF CORRECTION

PATENT NO.    : 6,506,622 B1
DATED         : January 14, 2003
INVENTOR(S)   : Atsushi Shiozaki It is certified that error appears in the above-identified patent and that said Letters Patent is hereby corrected as shown below:

Column 2,
Line 37, "25. 4 mA/cm$^2$" should read -- 25.4 mA/cm$^2$ --.

Column 6,
Line 31, "photoeletromotive" should read -- photoelectromotive --.

Column 13,
Line 13, "specifically" should read -- specifically, --.

Column 15,
Line 27, "shielded," should read -- shielded --.

Column 17,
Line 36, "allowed to" should read -- allowed --.

Column 19,
Line 37, "conditions," should read -- conditions, with --.

Column 20,
Line 43, "formed an" should read -- formed --.

Column 22,
Line 59, "i type" should read -- i-type --.

Column 23,
Line 35, "i-type second" should read -- i-type --.

UNITED STATES PATENT AND TRADEMARK OFFICE
CERTIFICATE OF CORRECTION

PATENT NO. : 6,506,622 B1
DATED : January 14, 2003
INVENTOR(S) : Atsushi Shiozaki It is certified that error appears in the above-identified patent and that said Letters Patent is hereby corrected as shown below:

Column 24,
Line 35, "$TA_{semi-above}$," should read -- $TA_{semi-above}$ --.

Signed and Sealed this

Ninth Day of September, 2003

JAMES E. ROGAN
*Director of the United States Patent and Trademark Office*